A semiconductor memory apparatus may include a cyclic redundancy check (CRC) circuit block electrically coupled with a first pad, and configured to generate internal CRC information from data received from the first pad. The semiconductor memory apparatus may also include a comparison unit configured to compare external CRC information received from outside the semiconductor memory apparatus with the internal CRC information, and generate a read training result signal.

9 Claims, 4 Drawing Sheets

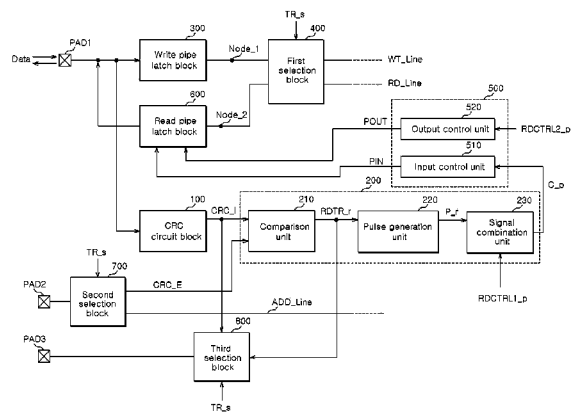

220

230

US 9,484,955 B2

SEMICONDUCTOR MEMORY APPARATUS AND TRAINING METHOD USING THE SAME

CROSS-REFERENCES TO RELATED APPLICATION

The present application claims priority under 35 U.S.C. §119(a) to Korean application number 10-2014-0071248, filed on Jun. 12, 2014, in the Korean Intellectual Property Office, which is incorporated herein by reference in its entirety.

BACKGROUND

1. Technical Field

Various embodiments generally relate to semiconductor integrated circuits, and more particularly, to semiconductor memory apparatuses and training methods using the same.

2. Related Art

A semiconductor memory apparatus may be configured to store data and output the stored data. This type of semiconductor memory apparatus may be applied to a system and may be controlled by a controller.

If the controller and the semiconductor memory apparatus are electrically coupled with each other, the controller may perform a training operation together with the semiconductor memory apparatus. After the training operation is performed, a normal operation may then be performed.

The training operation is an operation for controlling the margin between the controller and the semiconductor memory apparatus. The normal operation is an operation for the semiconductor memory apparatus to store data and output the stored data under the control of the controller.

SUMMARY

In an embodiment, a semiconductor memory apparatus may include a cyclic redundancy check (CRC) circuit block electrically coupled with a data pad, and configured to generate internal CRC information from data received from the data pad. The semiconductor memory apparatus may also include a comparison unit configured to compare external CRC information received from outside the semiconductor memory apparatus with the internal CRC information, and may generate a read training result signal.

In an embodiment, a semiconductor memory apparatus may include a CRC circuit block configured to receive data from a first pad and generate internal CRC information, a training determination block configured to compare the internal CRC information with external CRC information and generate a read training result signal, and generate a combination pulse in response to the read training result signal and a first read pipe latch control pulse. The semiconductor memory apparatus may also include a write pipe latch block configured to receive and latch the data, and output latched data. The semiconductor memory apparatus may include a first selection block configured to electrically couple an output node of the write pipe latch block with an input node of a read pipe latch block in response to a training control signal, the read pipe latch block configured to receive and latch data inputted through the input node thereof and output latched data to the first pad, in response to a pipe input signal and a pipe output signal. The semiconductor memory apparatus may also include a read pipe latch control block configured to generate the pipe input signal and the pipe output signal in response to a second read pipe latch control pulse and the combination pulse.

In an embodiment, a training method of a semiconductor memory apparatus may include a read training operation including an internal CRC information generating action of receiving data and generating internal CRC information, a comparing action of comparing the internal CRC information and external CRC information inputted from an exterior and generating a read training result signal, and a first outputting action of outputting the read training result signal to an exterior. The training method of a semiconductor memory apparatus may also include an action of inputting the data used to generate the internal CRC information, to a read pipe latch block, and latching the inputted data, when the read training result signal is at a predetermined level. The training method of a semiconductor memory apparatus may include a write training operation including a second outputting action of outputting the data latched by the read pipe latch block outside of the semiconductor memory apparatus.

DETAILED DESCRIPTION

Hereinafter, a semiconductor memory apparatus will be described below with reference to the accompanying drawings through various examples of embodiments.

Figure 1:
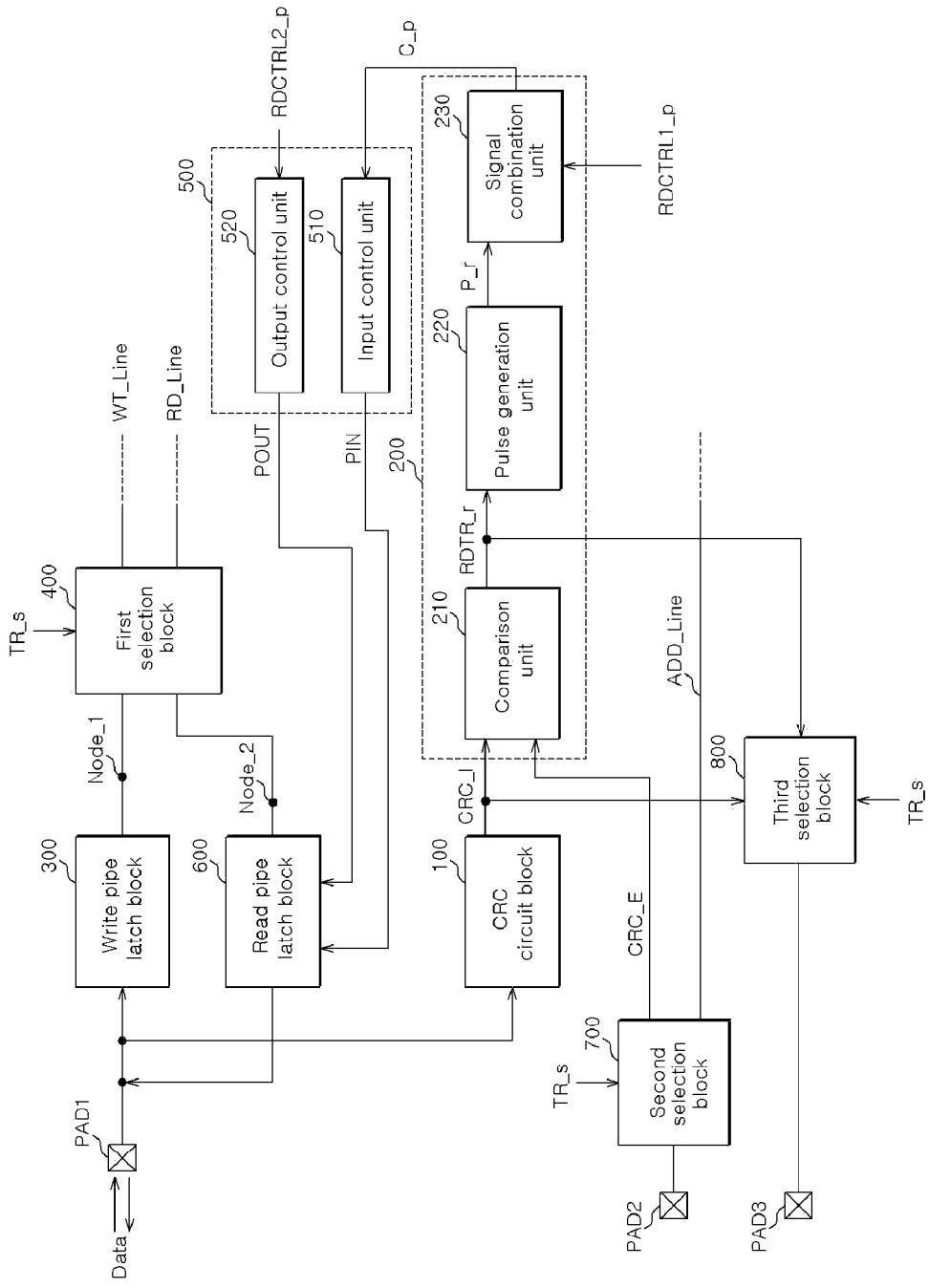
FIG. 1 is a configuration diagram illustrating a representation of an example of a semiconductor memory apparatus in accordance with an embodiment.

Referring to FIG. 1, a semiconductor memory apparatus in accordance with an embodiment may include first to third pads PAD1, PAD2 and PAD3. The semiconductor memory apparatus may also include a cyclic redundancy check (CRC) circuit block 100, a training determination block 200, and a write pipe latch block 300. The semiconductor memory apparatus may also include a first selection block 400, a read pipe latch control block 500, and a read pipe latch block 600. The semiconductor memory apparatus may include a second selection block 700 and a third selection block 800.

As indicated by the arrows illustrated in FIG. 1, the first pad PAD1 may be inputted with or receive data Data from a source exterior to the semiconductor memory apparatus. The first pad PAD1 may also output data Data exterior from the semiconductor memory apparatus. The first pad PAD1 may be a data pad.

The second pad PAD2 may be inputted with or receive an address from a source exterior to the semiconductor memory apparatus in a normal operation. In a training operation, the second pad PAD2 may be inputted with or receive external CRC information CRC_E. The second pad PAD2 may be an address input pad.

The third pad PAD3 may output internal CRC information CRC_I exterior to the semiconductor memory apparatus in the normal operation. In the training operation, the third pad PAD3 may output a read training result signal RDTR_r exterior to the semiconductor memory apparatus. The third pad PAD3 may be a CRC output pad.

The CRC circuit block 100 may be inputted with the data Data inputted from the first pad PAD1 and may generate the internal CRC information CRC_I. CRC stands for cyclic redundancy check. The CRC circuit block 100 may be a CRC circuit which is generally known in the art.

The training determination block 200 may compare the internal CRC information CRC_I and the external CRC information CRC_E and may generate the read training result signal RDTR_r, and may generate a combination pulse C_p in response to the read training result signal RDTR_r and a first read pipe latch control pulse RDCTRL1_p. For example, the training determination block 200 may enable the read training result signal RDTR_r when the internal CRC information CRC_I and the external CRC information CRC_E are the same with each other, and may generate the combination pulse C_p when the read training result signal RDTR_r is enabled (i.e., at a predetermined level or voltage logic level) or the first read pipe latch control pulse RDCTRL1_p is inputted or received by the training determination block 200.

As illustrated in FIG. 1, the training determination block 200 may include a comparison unit 210, a pulse generation unit 220, and a signal combination unit 230.

The comparison unit 210 may enable the read training result signal RDTR_r when the internal CRC information CRC_I and the external CRC information CRC_E are the same with each other. The comparison unit 210 may disable the read training result signal RDTR_r when the internal CRC information CRC_I and the external CRC information CRC_E are different from each other.

The pulse generation unit 220 may generate a result pulse P_r when the read training result signal RDTR_r is enabled.

Figure 2:
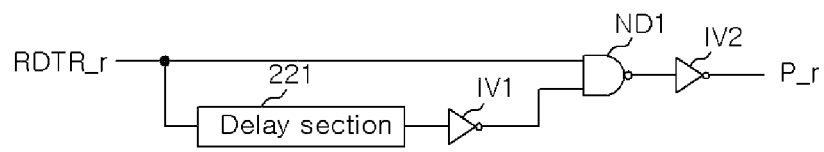
FIG. 2 is a configuration diagram of a representation of the pulse generation unit illustrated in FIG. 1.
Figure 2:
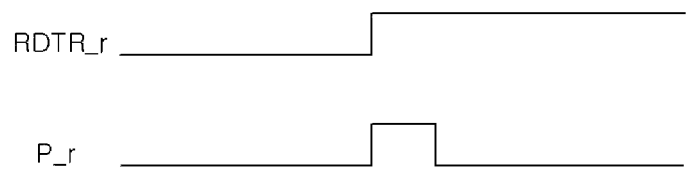

Referring to FIG. 2, the pulse generation unit 220 may include a delay section 221, first and second inverters IV1 and IV2, and a NAND gate ND1. The delay section 221 may be inputted with the read training result signal RDTR_r. The first inverter IV1 may be inputted with the output signal of the delay section 221. The NAND gate ND1 may be inputted with the read training result signal RDTR_r and the output signal of the first inverter IV1. The second inverter IV2 may be inputted with the output signal of the NAND gate ND1 and may generate the result pulse P_r. The pulse generation unit 220 configured in this way generates the result pulse P_r which is enabled to a high level, when the read training result signal RDTR_r is enabled to a high level.

The signal combination unit 230 may output the combination pulse C_p when the result pulse P_r or the first read pipe latch control pulse RDCTRL1_p is inputted or received. The first read pipe latch control pulse RDCTRL1_p, as a pulse which is internally generated in a read operation of the semiconductor memory apparatus, may be a pulse for inputting and storing the data stored in the semiconductor memory apparatus (for example, the data transmitted from a read data line RD_Line), to and in the read pipe latch block 600, in the read operation.

Figure 3:
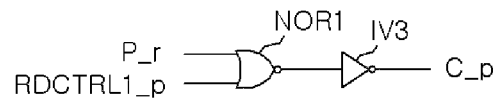
FIG. 3 is a configuration diagram of a representation of the signal combination unit illustrated in FIG. 1.

Referring to FIG. 3, the signal combination unit 230 may include a NOR gate NOR1 and a third inverter IV3. The NOR gate NOR1 may be inputted with the result pulse P_r and the first read pipe latch control pulse RDCTRL1_p. The third inverter IV3 may be inputted with the output signal of the NOR gate NOR1 and may output the combination pulse C_p.

The write pipe latch block 300 may be inputted with and may latch the data Data inputted from the first pad PAD1, and may output latched data to its output node Node_1.

The first selection block 400 may electrically couple the output node Node_1 of the write pipe latch block 300 to an input node Node_2 of the read pipe latch block 600 in response to a training control signal TR_s. For example, the first selection block 400 may electrically couple the output node Node_1 of the write pipe latch block 300 to the input node Node_2 of the read pipe latch block 600 when the training control signal TR_s is enabled. When the training control signal TR_s is disabled, the first selection block 400 may electrically couple the output node Node_1 of the write pipe latch block 300 to a write data line WT_Line, and may electrically couple the input node Node_2 of the read pipe latch block 600 to the read data line RD_Line. The training control signal TR_s, as a signal which is enabled when performing the training operation between a controller and the semiconductor memory apparatus, is a signal which is outputted from an exterior of the semiconductor memory apparatus, that is, the controller and received by the semiconductor memory apparatus or for example, the first selection block 400.

Figure 4:
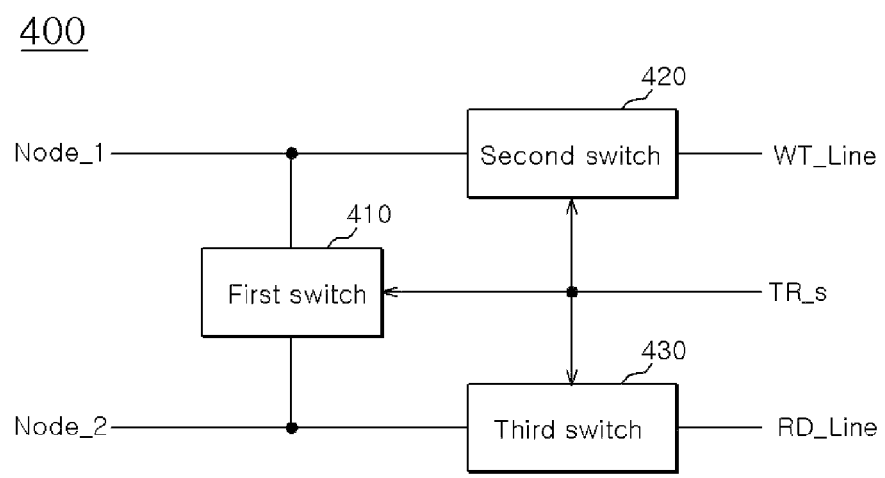
FIG. 4 is a configuration diagram of a representation of the first selection block illustrated in FIG. 1.

Referring to FIG. 4, the first selection block 400 may include first to third switches 410, 420, and 430.

The first switch 410 may electrically couple or decouple the output node Node_1 of the write pipe latch block 300 and the input node Node_2 of the read pipe latch block 600 in response to the training control signal TR_s. For example, the first switch 410 may electrically couple the output node Node_1 of the write pipe latch block 300 and the input node Node_2 of the read pipe latch block 600 when the training control signal TR_s is enabled. The first switch 410 may electrically decouple the output node Node_1 of the write pipe latch block 300 and the input node Node_2 of the read pipe latch block 600 when the training control signal TR_s is disabled.

The second switch 420 may electrically couple or decouple the output node Node_1 of the write pipe latch block 300 and the write data line WT_Line in response to the training control signal TR_s. For example, the second switch 420 may electrically couple the output node Node_1 of the write pipe latch block 300 and the write data line WT_Line when the training control signal TR_s is disabled. The second switch 420 may electrically decouple the output node Node_1 of the write pipe latch block 300 and the write data line WT_Line when the training control signal TR_s is enabled.

The third switch 430 may electrically couple or decouple the input node Node_2 of the read pipe latch block 600 and the read data line RD_Line in response to the training control signal TR_s. For example, the third switch 430 may electrically couple the input node Node_2 of the read pipe latch block 600 and the read data line RD_Line when the training control signal TR_s is disabled. The third switch 430 may electrically decouple the input node Node_2 of the read pipe latch block 600 and the read data line RD_Line when the training control signal TR_s is enabled.

Referring to FIG. 1, the read pipe latch control block 500 may enable a pipe input signal PIN when the combination pulse C_p is inputted or received by the read pipe latch control block 500. The read pipe latch control block 500 may enable a pipe output signal POUT when a second read pipe latch control pulse RDCTRL2_p is enabled. The second read pipe latch control pulse RDCTRL2_p, as a pulse which is internally generated in the read operation of the semiconductor memory apparatus, may be a pulse for outputting the data stored in the read pipe latch block 600 to the first pad PAD1 in the read operation.

The read pipe latch control block 500 may include an input control unit 510 and an output control unit 520. The input control unit 510 may enable the pipe input signal PIN when the combination pulse C_p is inputted. The output control unit 520 may enable the pipe output signal POUT when the second read pipe latch control pulse RDCTRL2_p is inputted.

The read pipe latch block 600 may be inputted with and may latch the data inputted through the input node Node_2 of the read pipe latch block 600 and may output latched data to the first pad PAD1, in response to the pipe input signal PIN and the pipe output signal POUT. For example, the read pipe latch block 600 is inputted, through the input node Node_2 thereof, with and latches data when the pipe input signal PIN is enabled. The read pipe latch block 600 may output the latched data to the first pad PAD1 when the pipe output signal POUT is enabled.

The second selection block 700 may electrically couple the second pad PAD2 and the comparison unit 210 of the training determination block 200 and may transmit the external CRC information CRC_E to the comparison unit 210 or may electrically couple the second pad PAD2 and an address line ADD_Line, in response to the training control signal TR_s. For example, the second selection block 700 may transmit the signal inputted thereto, to the comparison unit 210, when the training control signal TR_s is enabled, and may transmit the signal inputted thereto, to the address line ADD_Line, when the training control signal TR_s is disabled. The second pad PAD2 may be inputted with the external CRC information CRC_E in the training operation, and may be inputted with an address (not illustrated) in the normal operation.

In response to the training control signal TR_s, the third selection block 800 may output the internal CRC information CRC_I or the read training result signal RDTR_r to the third pad PAD3. For example, the third selection block 800 may output the read training result signal RDTR_r to the third pad PAD3 when the training control signal TR_s is enabled. The third selection block 800 may output the internal CRC information CRC_I to the third pad PAD3 when the training control signal TR_s is disabled.

A training method of the semiconductor memory apparatus in accordance with an embodiment, configured as mentioned above, will be described below.

Since the training operation is to be described, the training control signal TR_s may be assumed to be in an enabled state.

First, a read training operation will be described below.

The data Data is inputted to the CRC circuit block 100 and the write pipe latch block 300 through the first pad PAD1.

The CRC circuit block 100 is inputted with the data Data and generates the internal CRC information CRC_I.

The external CRC information CRC_E is inputted through the second pad PAD2 and the second selection block 700.

The comparison unit 210 compares the internal CRC information CRC_I and the external CRC information CRC_E and generates the read training result signal RDTR_r. The comparison unit 210 enables the read training result signal RDTR_r when the internal CRC information CRC_I and the external CRC information CRC_E are the same with each other.

The third selection block 300 outputs the read training result signal RDTR_r to the third pad PAD3.

If the read training result signal RDTR_r is enabled, the pulse generation unit 220 generates the result pulse P_r. If the pulse generation unit 220 generates the result pulse P_r, the combination pulse C_p is generated, and the input control unit 510 enables the pipe input signal PIN. If the pipe input signal PIN is enabled, the data Data inputted to the CRC circuit block 100, that is, the data Data latched by the write pipe latch block 300 is inputted through the first selection block 400 to and is latched by the read pipe latch block 600.

In this way, as the read training result signal RDTR_r is outputted to the third pad PAD3 and the data Data used to generate the internal CRC information CRC_I is stored in the read pipe latch block 600 when the read training result signal RDTR_r is enabled, the read training operation is completed.

A write training operation after the read training operation is completed will be described below.

If the data Data used to generate the internal CRC information CRC_I is latched by the read pipe latch block 600, the second read pipe latch control pulse RDCTRL2_p is generated and the data latched by the read pipe latch block 600 is outputted to the first pad PAD1, whereby the write training operation is completed.

If the read training result signal RDTR_r is not enabled but is in a disabled state, data is latched by the read pipe latch block 600 through the first pad PAD1, the write pipe latch block 300 and the first selection block 400, and the latched data is outputted, whereby the write training operation is completed.

In the semiconductor memory apparatus in accordance with the embodiments, since the read training operation may be performed by receiving data through a pad for inputting and outputting data, a large amount of data may be latched at once, whereby a time required for performing the read training operation may be shortened. Also, if the read training result signal RDTR_r is enabled while performing the read training operation, the data used in the previous read training operation is latched by the read pipe latch block 600 and the latched data is outputted in the write training operation, without the necessity of inputting data again and latching the data by the read pipe latch block 600, whereby a time required for performing the write training operation may also be shortened.

Figure 5:
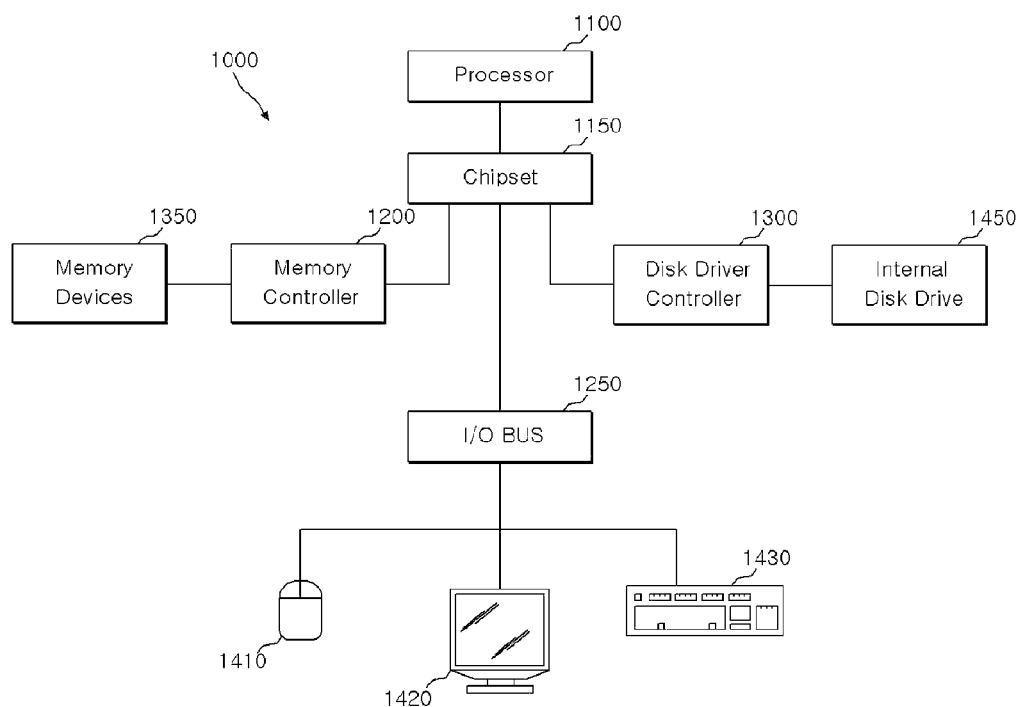
FIG. 5 illustrates a block diagram of an example of a representation of a system employing the methods and semiconductor memory apparatuses in accordance with the embodiments discussed above with relation to FIGS. 1-4.

The methods and semiconductor memory apparatuses discussed above (see FIGS. 1-4) are particular useful in the design of memory devices, processors, and computer systems. For example, referring to FIG. 5, a block diagram of a system employing the methods and semiconductor memory apparatuses in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor memory apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor memory apparatus described herein should not be limited based on the described embodiments.

What is claimed is:

1. A semiconductor memory apparatus comprising:
   a cyclic redundancy check (CRC) circuit block configured to receive a first data from a first pad and generate internal CRC information;
   a training determination block configured to compare the internal CRC information with external CRC information and generate a read training result signal, and generate a combination pulse in response to the read training result signal and a first read pipe latch control pulse;
   a write pipe latch block configured to receive and latch the first data, and output a latched first data;
   a first selection block configured to electrically couple an output node of the write pipe latch block with an input node of a read pipe latch block in response to a training control signal;
   the read pipe latch block configured to receive and latch a second data inputted through the input node thereof and output a latched second data to the first pad, in response to a pipe input signal and a pipe output signal; and
   a read pipe latch control block configured to generate the pipe input signal and the pipe output signal in response to a second read pipe latch control pulse and the combination pulse.

2. The semiconductor memory apparatus according to claim 1, wherein the training determination block comprises:
   a comparison unit configured to compare the internal CRC information with the external CRC information, and generate the read training result signal;
   a pulse generation unit configured to generate a result pulse in response to the read training result signal; and
   a signal combination unit configured to output the combination pulse when the result pulse or the first read pipe latch control pulse is received by the signal combination unit.

3. The semiconductor memory apparatus according to claim 2, wherein the pulse generation unit comprises:
   a delay section configured for receiving the read training result signal;
   a first inverter configured for receiving an output of the delay section;
   a first logic gate configured for receiving an output of the first inverter and the read training result signal; and
   a second inverter configured for inverting an output of the logic gate and outputting the result pulse.

4. The semiconductor memory apparatus according to claim 3, wherein the signal combination unit comprises:
   a second logic gate configured for receiving the result pulse and the first read pipe latch control pulse; and
   a third inverter configured for receiving the output of the second logic gate and outputting the combination pulse.

5. The semiconductor memory apparatus according to claim 1, wherein the first selection block electrically couples the output node of the write pipe latch block with the input node of the read pipe latch block when the training control signal is enabled, and electrically couples the output node of the write pipe latch block with a write data line and electrically couples the input node of the read pipe latch block with a read data line when the training control signal is disabled.

6. The semiconductor memory apparatus according to claim 5, wherein the first selection block comprises:
   a first switch configured to electrically couple and decouple the output node of the write pipe latch block with the input node of the read pipe latch block in response to the training control signal;
   a second switch configured to electrically couple and decouple the output node of the write pipe latch block with the write data line in response to the training control signal; and
   a third switch configured to electrically couple and decouple the input node of the read pipe latch block with the read data line in response to the training control signal.

7. The semiconductor memory apparatus according to claim 1, further comprising:
   a second selection block configured to electrically couple a second pad to the training determination block and transmit the external CRC information to the training determination block or electrically couple the second pad to an address line and transmit an address to the address line, in response to the training control signal; and
   a third selection block configured to transmit the internal CRC information to a third pad or transmit the read training result signal to the third pad, in response to the training control signal.

8. A training method of a semiconductor memory apparatus, comprising:
   a read training operation including
   an internal cyclic redundancy check (CRC) information generating action of receiving data and generating internal CRC information,
   a comparing action of comparing the internal CRC information and external CRC information inputted from outside the semiconductor memory apparatus and generating a read training result signal,
   a first outputting action of outputting the read training result signal to outside the semiconductor memory apparatus, and
   an action of inputting the data used to generate the internal CRC information, to a read pipe latch block, and latching the inputted data, when the read training result signal is at a predetermined level; and
   a write training operation including a second outputting action of outputting the data, latched by the read pipe latch block, outside of the semiconductor memory apparatus.

9. The training method according to claim 8, wherein the action of inputting the data used to generate the internal CRC information, to the read pipe latch block, and latching the inputted data comprises:
   receiving the data, inputting the data to a write pipe latch block, and latching the inputted data; and
   inputting the data latched by the write pipe latch block, to the read pipe latch block, and latching the inputted data, in response to the read training result signal.

* * * * *